(12) United States Patent
Yamauchi

(10) Patent No.: US 6,574,169 B1
(45) Date of Patent: Jun. 3, 2003

(54) DELAY TEST SYSTEM FOR NORMAL CIRCUIT

(75) Inventor: Hisashi Yamauchi, Tokyo (JP)

(73) Assignee: NEC Electronics Corporation (JP)

(*) Notice: Subject to any disclaimer, the term of this patent is extended or adjusted under 35 U.S.C. 154(b) by 396 days.

(21) Appl. No.: 09/631,561

(22) Filed: Aug. 3, 2000

Related U.S. Application Data

(62) Division of application No. 09/093,381, filed on Jun. 8, 1998, now Pat. No. 6,128,253.

(30) Foreign Application Priority Data

Jun. 9, 1997 (JP) ............................................. 9-151261

(51) Int. Cl.[7] ............................ G04F 8/00; H03H 11/26
(52) U.S. Cl. ....................... 368/120; 368/117; 327/265; 324/617; 331/57
(58) Field of Search ......................... 368/113, 114–120; 375/228, 362, 354, 323; 324/617, 633; 331/57; 327/265

(56) References Cited

U.S. PATENT DOCUMENTS

| | | | | | |
|---|---|---|---|---|---|
| 4,613,951 A | * | 9/1986 | Chu | ............................ | 368/120 |
| 4,995,019 A | * | 2/1991 | Begin | .......................... | 368/117 |
| 5,796,682 A | * | 8/1998 | Swapp | ........................ | 368/117 |
| 5,818,797 A | * | 10/1998 | Wantanabe et al. | .......... | 368/120 |
| 6,233,205 B1 | * | 5/2001 | Wells et al. | ................. | 368/118 |
| 6,356,514 B1 | * | 3/2002 | Wells et al. | ................. | 368/118 |
| 6,452,459 B1 | * | 9/2002 | Chan et al. | .................. | 368/118 |
| 6,466,520 B1 | * | 10/2002 | Speyer et al. | ................ | 368/118 |
| 6,473,455 B1 | * | 10/2002 | Kwon | ......................... | 375/362 |

* cited by examiner

*Primary Examiner*—Vit Miska
*Assistant Examiner*—Jeanne-Marguerite Goodwin
(74) *Attorney, Agent, or Firm*—Hayes Soloway P.C.

(57) ABSTRACT

A delay test system includes an electronic circuit, such as a normal circuit which has a portion to be tested and a plurality of flip-flop circuits. In this event, each of flip-flop circuits is serially connected to each other to perform a delay test for said normal circuit. Further, a first clock input terminal is connected to the flip-flips and a normal circuit to input a normal mode clock signal. Moreover, a second clock input terminal is connected to the flip-flop circuits and the normal circuit to input a test clock signal. With such a structure, an input and output operation of data signals is carried out in synchronism with edge timings determined by both the normal mode clock signal in the normal mode on the condition that the test clock signal is not supplied to the second clock input terminal. On the other hand, the first and second clock input terminals are separately driven by the normal mode clock signal and the test clock signal in the test mode. Consequently, a delay test is carried out by the use of a timing difference between an edge timing of the normal mode clock signal and an edge timing of the test clock signal.

9 Claims, 17 Drawing Sheets

DELAY TEST SYSTEM FOR NORMAL CIRCUIT

This application is a division of U.S. patent application Ser. No. 09/093,381, filed Jun. 8, 1998, now U.S. Pat. No. 6,128,253.

BACKGROUND OF THIS INVENTION

This invention relates to a delay test system of testing a normal circuit, such as an LSI.

Conventionally, a wide variety of tests have been performed to check whether or not each LSI is normally operated. In such tests, a delay test is included to test whether or not an undesirable delay takes place among logic circuits included in the LSI. To this end, a tester has been generally used to carry out the delay test of the LSI. In this event, the tester should generate a clock sequence of a high frequency and must have a very high performance. However, such a high performance tester is inevitably expensive.

On the other hand, it is a recent trend that an LSI is operated at a high speed and is therefore supplied with a very high frequency clock sequence. In order to test such an LSI operated at a high speed, a tester of the type described is also capable of supplying the LSI with a clock sequence of a high frequency. Otherwise, the delay test of such a high frequency LSI can not be preformed by the conventional tester of a low frequency. Under the circumstances, a delay test can not be practically performed by the use of the conventional tester.

Taking the above into consideration, some suggestions recently have been made about a method of performing the delay test with the tester having a low operation frequency. For instance, various methods have been disclosed in proceedings of International Test Conference 1995, page 302 to page 310, entitled "High-Performance Circuit Testing with Slow-Speed Testers".

However, each of the testers should have a large amount of overhead with respect to the LSI structure. To avoid this, it is necessary to broadly change a conventional method of designing the LSI.

From this fact, it is readily understood that a conventional delay test method requires the high-speed tester. Further, when the high-speed tester is not required, a large amount of overhead is inescapably required to perform the delay test. Moreover, the method of designing the normal circuit must be also changed to effectively perform the conventional delay test in connection with a high speed LSI.

SUMMARY OF THIS INVENTION

It is therefore an object of this invention to provide a delay test method which is capable of performing a delay test of a LSI at a high speed with a tester having a low operation frequency without changing a design style of a normal circuit.

It is another object of this invention to provide an integrated circuit which is operable at a high speed and testable at a low frequency.

According to this invention, a delay test system includes a normal circuit which has a portion to be tested and a plurality of flip-flop circuits. In this event, each of flip-flop circuits is serially connected to each other to perform a delay test for said normal circuit.

Further, a first clock input terminal is connected to the flip-flips and the normal circuit to input a normal clock signal. Moreover, a second clock input terminal is connected to the flip-flop circuits and the normal circuit to input a test clock signal.

With such a structure, an input and output operation of data signals is carried out in synchronism with edge timings of a normal clock signal during a normal operation on the condition that the second clock input terminal is halted.

On the other hand, the first and second clock input terminals are separately driven during the delay test. Consequently, the delay test is carried out by the use of a timing difference between a first edge timing of the normal clock signal and a second edge timing of the test clock signal.

More specifically, the flip-flop executes a single-phase synchronous operation during the normal operation while the flip-flop executes a double phase synchronous operation during the delay test operation.

In the event, the second clock input terminal is kept to a constant logic value in the single-phase synchronous operation. On the other hand, the first and second clock input terminals are separately driven in the double phase synchronous operation.

In this event, the design style of the normal circuit is invariable, and only the flip-flop is slightly changed so that there is no additional overhead.

Further, the result of the delay test is judged by the use of the timing difference between the clock edges. Consequently, the delay test can be carried out at a high speed without raising the frequency of the clock frequency of the tester.

DESCRIPTION OF THE PREFERRED EMBODIMENTS

Referring to FIGS. 1 through 8, conventional delay test methods will be first described for better understanding of this invention. The delay test methods which will be described with reference to FIGS. 1 through 7 are substantially equivalent to those mentioned in the proceedings referenced in the preamble of the instant specification.

Figure 1:
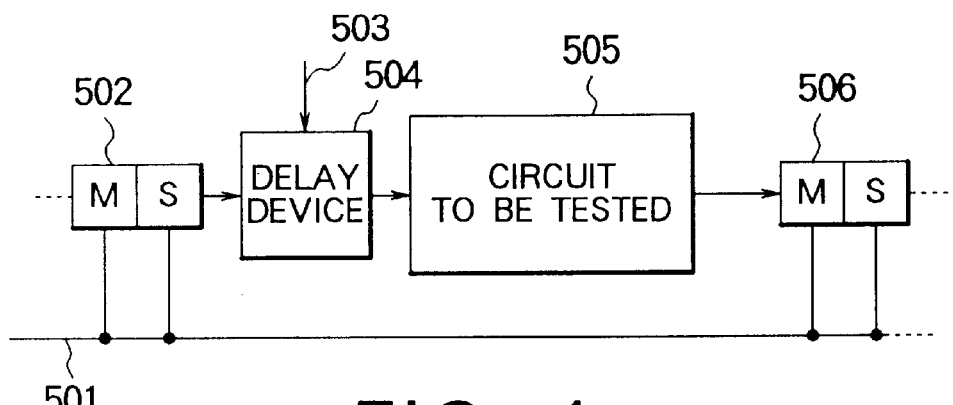
FIG. 1 is a circuit diagram of a first conventional example.
Figure 2:
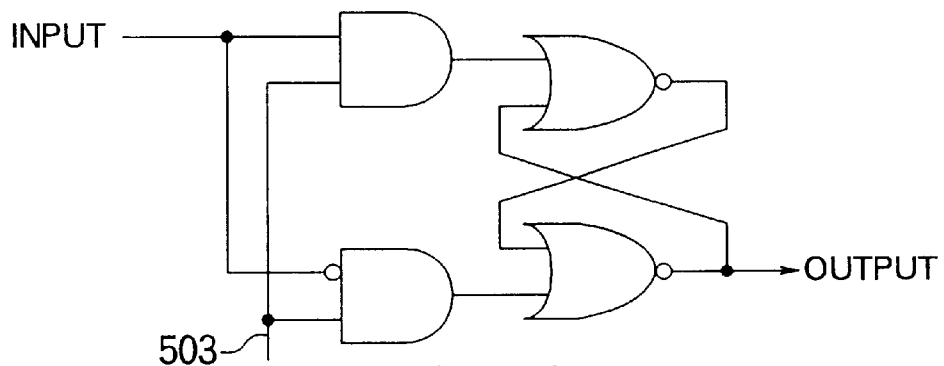
FIG. 2 is a circuit diagram of a delay control circuit which is used in the circuit illustrated in FIG. 1.
Figure 3:
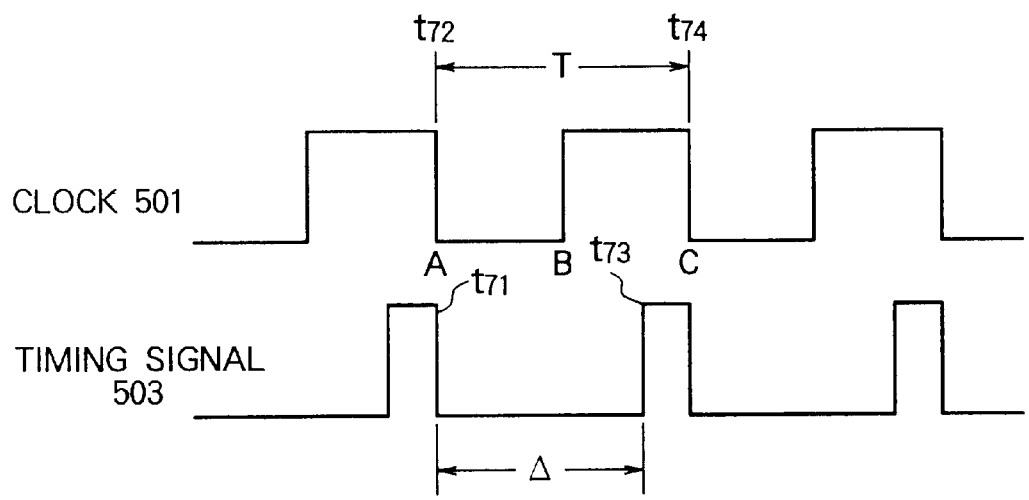
FIG. 3 is a timing chart of the circuit illustrated in FIG. 1.

As shown in FIGS. 1 through 3, a first one of the conventional delay test methods is for testing a circuit 505 which is to be tested and which will be called a test circuit below. The test circuit 505 is structured by an integrated circuit. In FIG. 1, pairs of flip-flop circuits 502 and 506 are arranged in front of and at the back of the test circuit 505. Each pair of the flip-flop circuits 502 and 506 illustrated in FIG. 1 is formed by a master flip-flop M and a slave flip-flop circuits coupled to the master flip-flop M and is used in the delay test.

In the illustrated example, a delay element or device 504 is interposed between the front flip-flop circuit 502 and the test circuit 505. Specifically, the delay device 504 is arranged to control a delay between the front flip-flop circuit 502 and the test circuit 505.

With such a structure, a clock sequence 501 is given to each of the flip-flop circuits 502 and 506 while another timing signal 503 is given to the delay device 504 at timing different from that of each of the clock sequence 501. Consequently, output timing from the flip-flop circuit 502 to the test circuit 505 is delayed by the timing signal 503. In this event, it is possible to shorten a difference between the output timing delayed by the delay device 504 and the clock timing of the clock sequence 501 in comparison with a clock period of the clock sequence. This shows that the test circuit 505 is apparently operable in response to a shortened clock sequence. Thus, the delay test can be apparently realized under a high clock frequency.

As shown in FIG. 3, the clock period of the clock sequence 501 is equal to a timing difference T between t72 and t74. On the other hand, a timing difference between t71 and t73 is delayed by the use of the timing of the timing signal 503. Thereby, the time necessary for the change which is permitted for the test circuit 505 is shortened to a time difference between t73 and t74.

However, the delay device 503 requires a latch as illustrated in FIG. 2. Consequently, an overhead inevitably becomes large on performing the delay test.

Subsequently, description will be made about a second conventional test method, referring to FIGS. 4 and 5.

Figure 4:
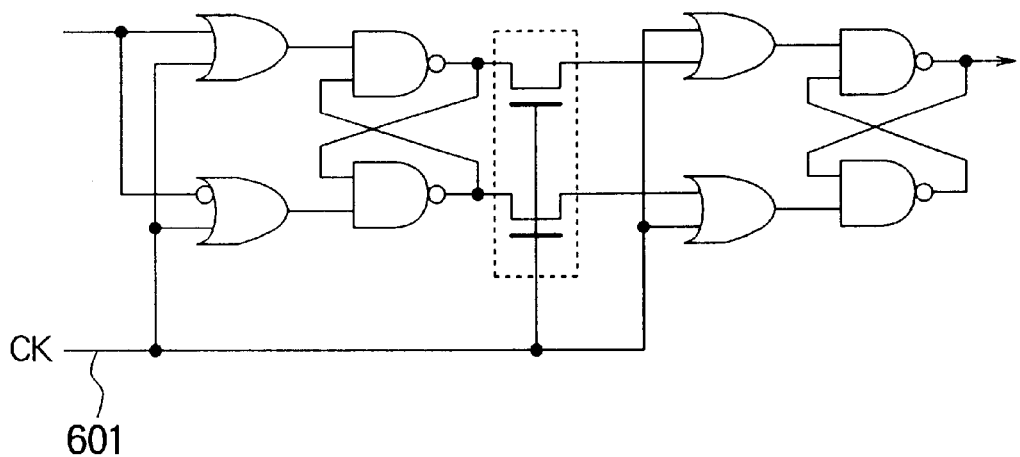
FIG. 4 is a circuit diagram of a second conventional example.
Figure 5:
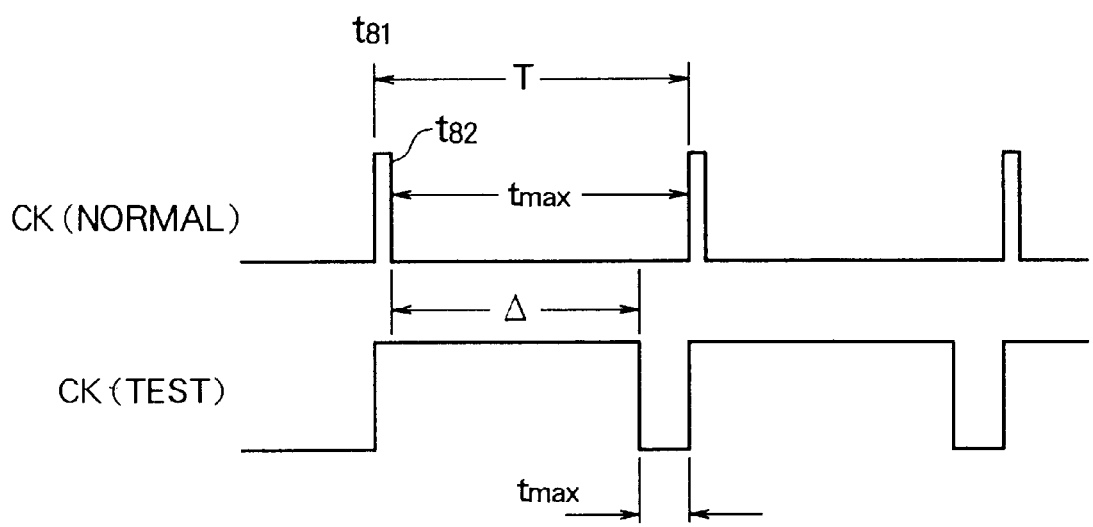
FIG. 5 is a timing chart of the circuit illustrated in FIG. 4.

The second conventional test method uses a flip-flop circuit of a pulse trigger type, as illustrated in FIG. 4. In this method, a duration for which the data signal is sent from the master side latch into the slave side latch in FIG. 4 must be excessively shortened. Thereby, the difference between t81 and t82 must be controlled by an excessively short pulse. As a result, a method of designing the integrated circuit itself should be changed with this method together with a clock generation method which is operated in the normal operation. In addition, the test operation should also be changed from a usual test method.

Figure 6:
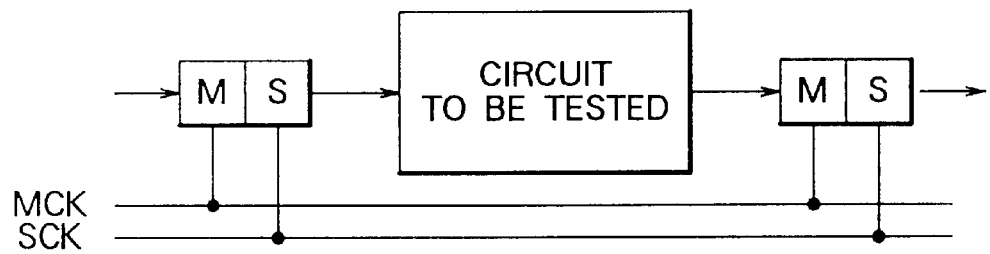
FIG. 6 is a circuit diagram of a third conventional example.

Subsequently, description will be made about a third conventional test method, referring to FIG. 6.

In the third conventional test method, two pairs of master latches M and slave latches S are located in front of and in the rear of the test circuit, respectively. Each of the master latches M is operable in response to a clock MCK while each of the slave latches S is operable in response to a clock SCK which is completely independent of a clock SCK.

However, the normal circuit must also be designed in a method different from a usual design method in order to perform the delay test of the illustrated circuit.

Next, description will be made about a fourth conventional test method, with reference to FIG. 7.

Figure 7:
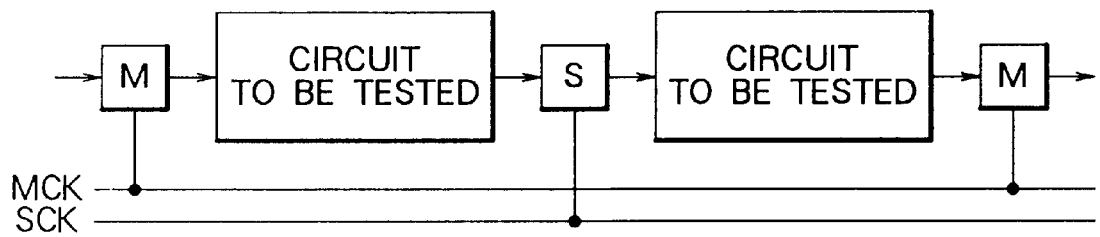
FIG. 7 is a circuit diagram of a fourth conventional example.

In the fourth conventional test method, a master latch and a slave latch are alternately arranged between the test circuits, as shown in FIG. 7, and are operated in response to master and slave clocks MCK and SCK which are different from each other. With this structure, designing the normal circuit must be also changed from the usual design method, like the third conventional method.

Further, when an input and output relationship between the latches becomes complicated in the circuit illustrated in FIG. 7, it is practically impossible to alternately arrange the master latch and the slave latch.

Subsequently, description will be made about a fifth conventional test method, referring to FIG. 8.

Herein, it is to be noted that the fifth conventional test method is substantially equivalent to that disclosed in Japanese Unexamined Patent Publication No. Hei. 6-347520, namely, 347520/1994.

Figure 8:
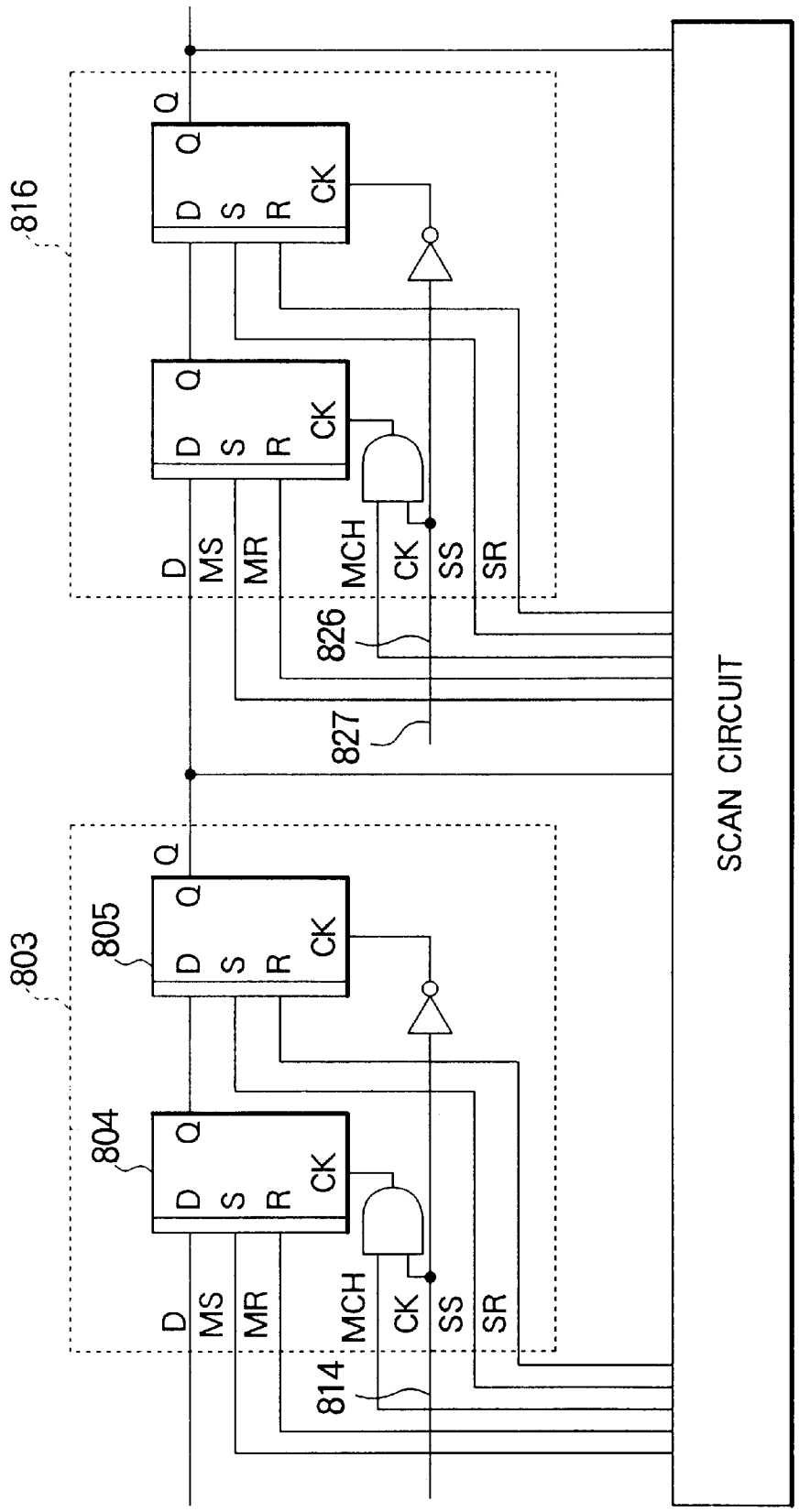
FIG. 8 is a circuit diagram of a fifth conventional example.

In the fifth conventional test method, use is made of a circuit as illustrated in FIG. 8. The illustrated circuit has circuit blocks 803 and 816 and a scan circuit coupled to both the circuit blocks 803 and 816. The circuit blocks 803 and 816 will be referred to as forward and backward stages, respectively. In this event, the circuit block 803 is structured by the use of master and slave flip-flop circuits 804 and 805 and is apparently operated like a single flip-flop. As shown in FIG. 8, the master flip-flop circuit has a gated clock structure which is driven through a gate. When the delay test is carried out, initial values are set to the forward stage 803 and the backward stage 816, respectively. Thereafter, the backward stage 816 alone is put into an enable state by supply of a clock to the backward stage 816 with the forward stage 803 kept at a hold state. In consequence, the set state of the forward stage is transferred to the backward stage and would be given to the backward stage together with the clock. Thus, the delay test can be performed in connection with a transmission path between the forward and the backward stages 803 and 816.

However, the clock 814 of the forward stage 803 must be controlled independently of the clock 827 of the backward side 816 in this method. Alternatively, a gate signal 813 of the forward stage 803 must be also controlled in a manner different from a gate signal 826 of the backward stage 816.

This means that the clock signal or the gate signal between the flip-flop circuits to be tested is sent through different external terminals and must be individually controlled. Alternatively, either one of a selected clock signal or an enable signal is given through an AND gate or an OR gate while another is connected to an external terminal or a decoder. In any event, the illustrated delay test is disadvantageous in that either the number of the external terminals or the number of the internal devices is inevitably increased so as to realize the delay test.

Taking the above-mentioned problems into consideration, this invention provides a delay test method which is capable of performing a delay test of an LSI at a high speed by the use of a tester which is operated at a low operation frequency. In addition, it is unnecessary to change a method of designing a normal circuit, when the normal circuit is tested according to the present invention.

(First Embodiment)

Referring to Fig, 9, description will be made about a first embodiment of this invention.

Figure 9:
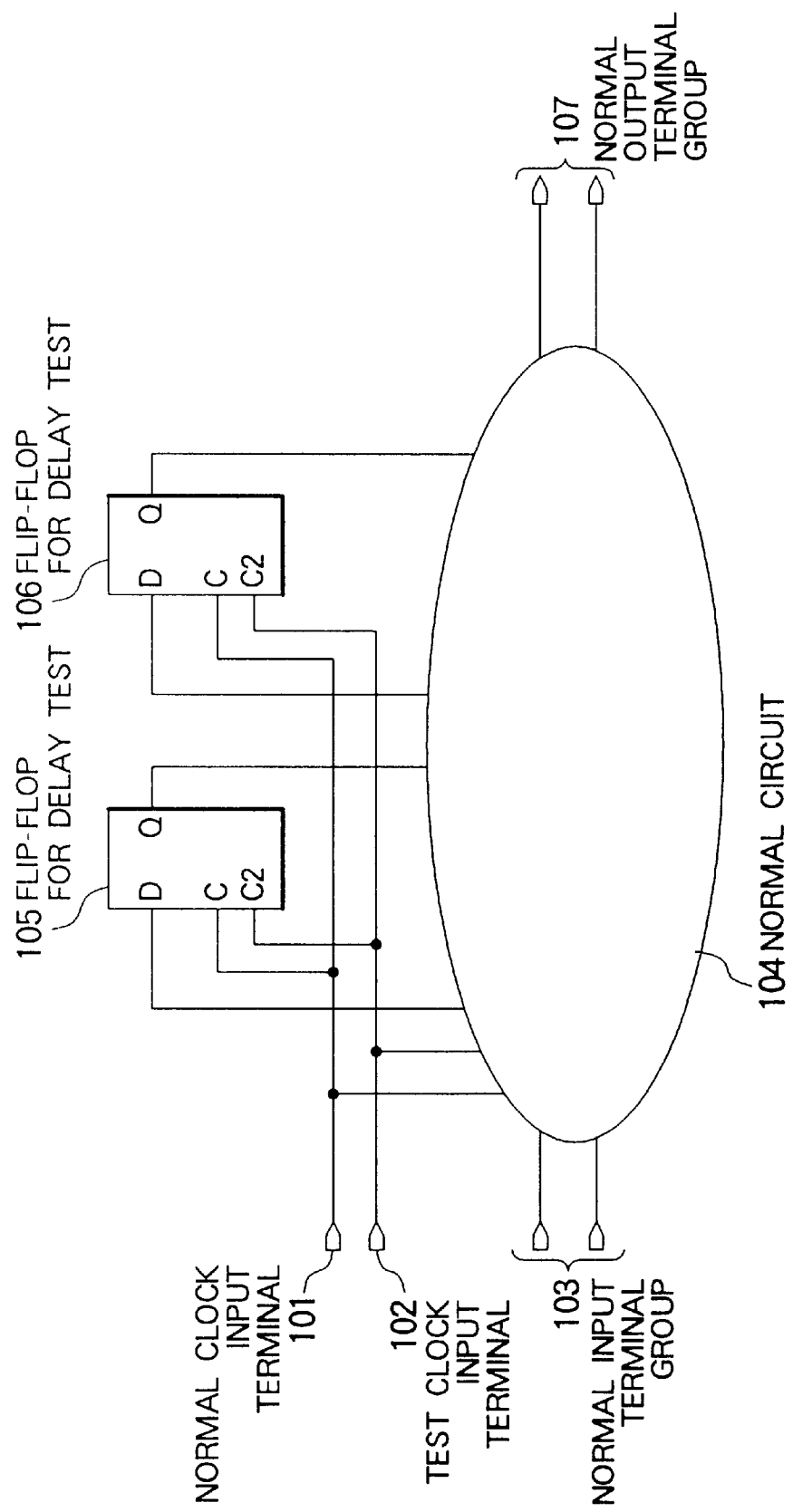
FIG. 9 is a circuit diagram of a first embodiment according to this invention.

In FIG. 9, the reference numeral 101 denotes an external clock terminal which is used during a normal operation while the reference numeral 102 denotes an test clock terminal which is used together with the external clock terminal 101 during a test operation. The reference numerals 105 and 106 denote a pair of flip-flop circuits for performing a delay test while the reference numeral 104 denotes an internal circuit (namely, a normal circuit) except the flip-flop circuits 105 and 106 and which includes a portion to be tested. The reference numeral 103 represents a group of input terminals of the normal circuit 104 while the reference numeral 107 represents a group of output terminals of the normal circuit 104.

Figure 10:
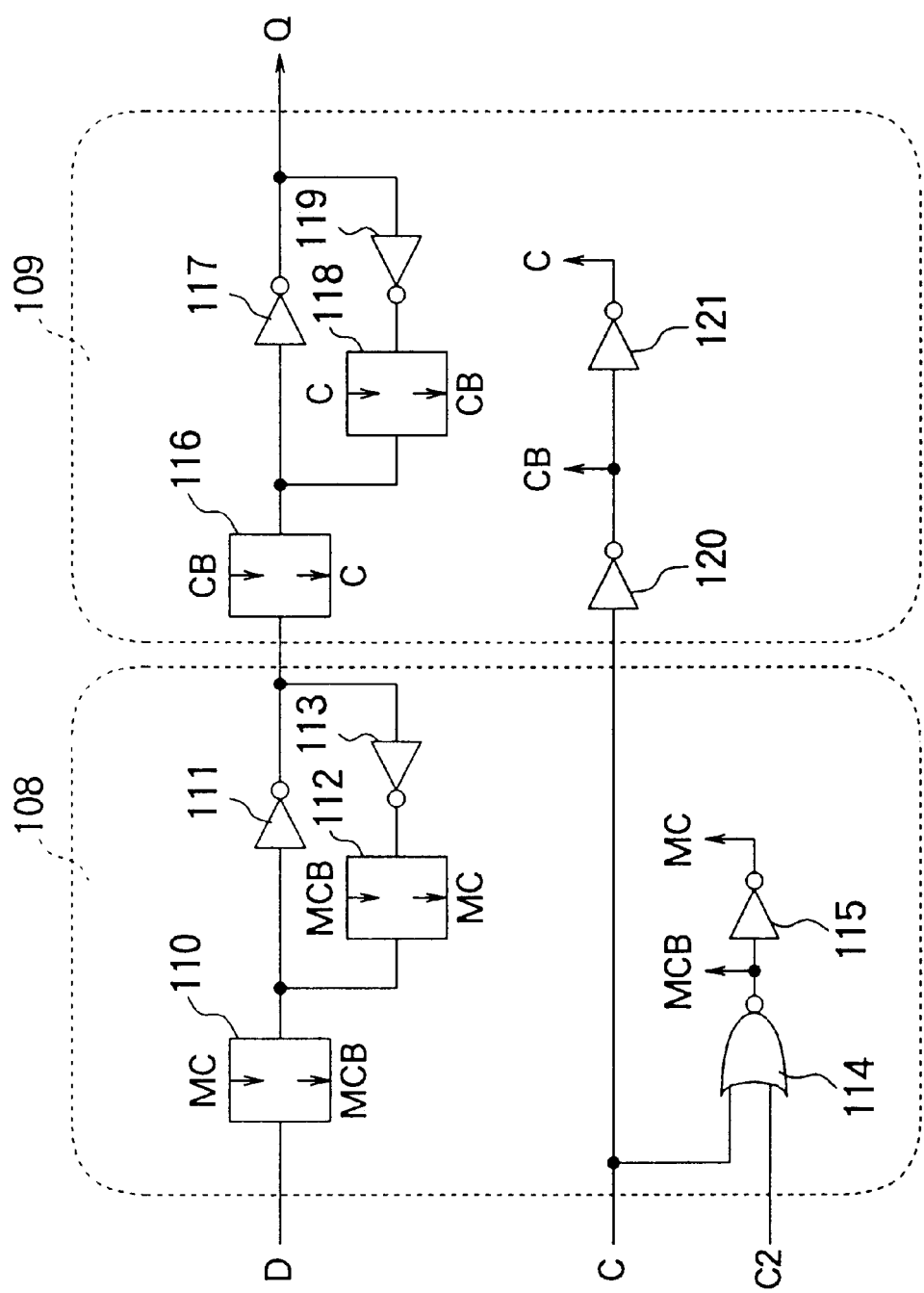
FIG. 10 is a circuit diagram showing a first structure example of each of flip-flop circuits 105 and 106 illustrated in FIG. 9.

Referring to FIG. 10 together with FIG. 9, description will be made about a first example of each of the flip-flop circuits 105 and 106 that is usable for the delay test. Herein, the reference symbols D, C, C2 and Q are used to represent both terminals shown in FIG. 9 and signals given to the respective terminals. In this sense, the reference symbol D is representative of both a data input terminal and a data input signal while C represents a normal clock input terminal and signal. Likewise, C2 represents a test clock input terminal and signal and Q represents an output terminal and an output signal.

As shown in FIG. 10, each of the flip-flop circuits 105 and 106 is similar in structure to each other and is composed of a master latch 108 and a slave latch 109. In the illustrated example, each of the flip-flop circuits 105 and 106 is assumed to be structured by CMOS transistors.

In FIG. 10, the master latch 108 is structured by transistor pairs 110 and 112, inverters 111, 113 and 115, and a NOR gate 114 while the slave latch 109 is composed of transistor pairs 116 and 118, and inverters 117, 119, 120 and 121. Herein, an upper half portion of each of the transistor pairs 110, 112, 116 and 118 which is symbolized by an upper downward arrow indicates a P-channel MOS transistor while a lower half portion thereof which is symbolized by a lower downward arrow indicates an N-channel MOS transistor. In this event, the upper and the lower downward arrows symbolize gate electrodes of the MOS transistors which are given gate signals which are specified by reference symbols attached to the respective arrows. In the illustrated example, each gate signal is given from a logic circuit illustrated in each lower part of the master and the slave latches 108 and 109. More specifically, the gate signals MC and MCB are given from the NOR gate 114 and the inverter 115, respectively, while the gate signals C and CB are given from the inverters 120 and 121, respectively.

As for the master latch 108, the gate signal MC is supplied from an output side of the inverter 115 to both the P-channel gate of the transistor pair 110 and the N-channel gate of the transistor pair 112. On the other hand, the gate signal MCB is supplied from an output side of the NOR gate 114 to both the N-channel gate of the transistor pair 110 and the P-channel gate of the transistor pair 112. This applies to the gate signals C and CB illustrated in the slave latch 109 of FIG. 10

Turning back to FIG. 9, each of the flip-flop circuits 105 and 106 acts as the flip-flop only in response to an input signal C when an input signal C2 takes a logic value "0". In this example, a data signal D is inputted into each flip-flop circuit 105 and 106 at the timing at which the input signal C is changed from the logic value "0" to the logic value "1". At the same time, an output signal of each flip-flop circuit 105 and 106 is also changed with the logic value.

Next, consideration is made about the case where the input signal C2 is changed from the logic value "0". In this event, the master latch 108 is kept at a hold state to keep the logic value at the timing at which the input signal C2 and the input signal C are kept at the logic 1 value "0" and at least one of the input signals C2 and C is changed to the logic value "1". Furthermore, the logic value is outputted through the slave latch 109 at the timing at which the input signal C is changed to the logic value "1".

Figure 11A:
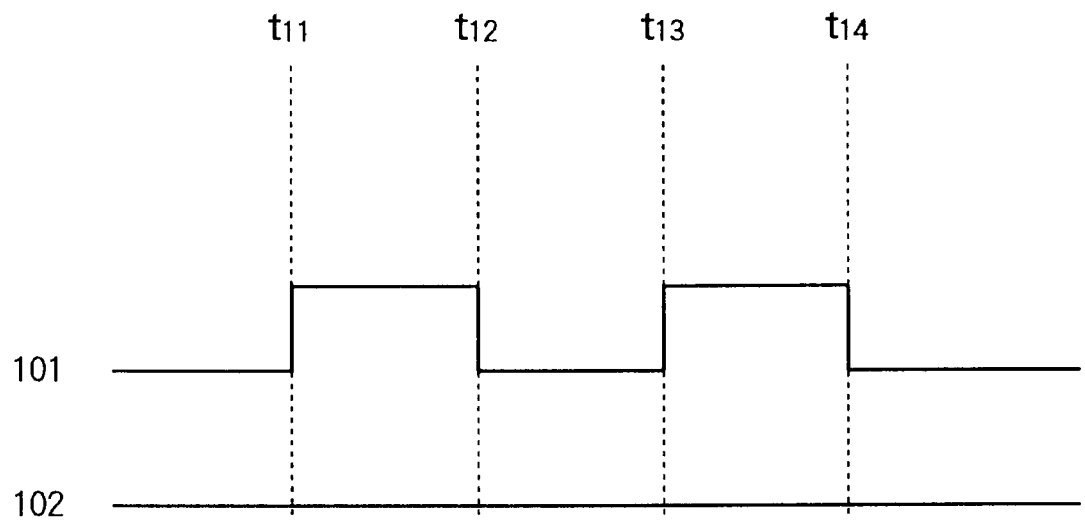
FIG. 11A is a timing chart during a normal operation of the first structure example.
Figure 11B:
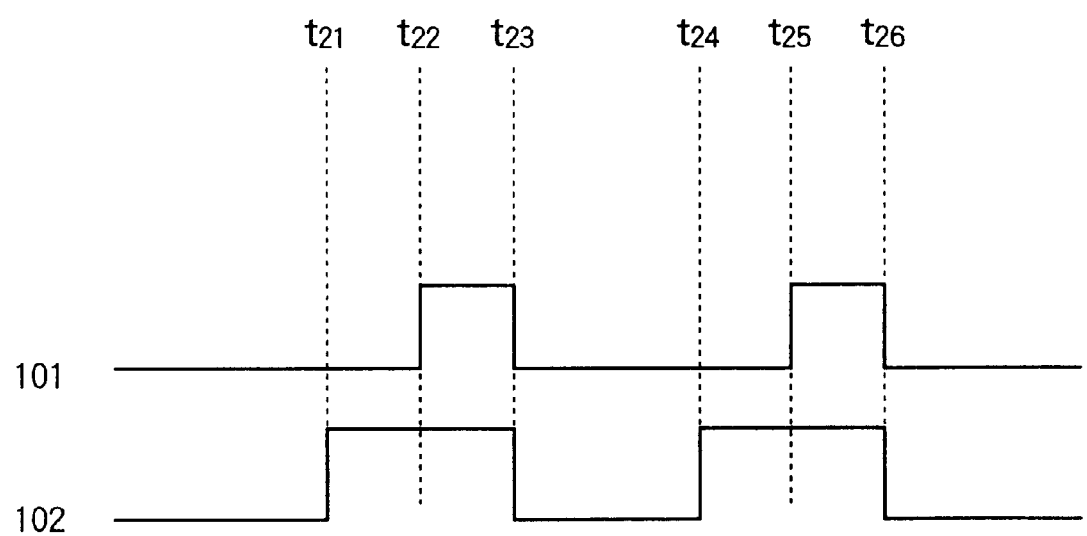
FIG. 11B is a timing chart during a delay test of the first structure example.

Referring to FIGS. 11A and 11B, the reference numerals 101 and 102 represent waveforms of the terminal 101 and the terminal 102 illustrated in FIG. 9, respectively. In FIG. 11A, the terminal 101 is changed from the logic value "0" (low level) into the logic value "1" (high level) at the timings t11 and t13 while the terminal 101 is changed from the logic value "1" into the logic value "0" at the timings t12 and t14. In this case, the terminal 102 is kept at the logic value "0" in a normal mode. During the normal mode, each flip-flop circuit is operated as a single-phase synchronization flip-flop. Consequently, a usual design method for such a normal circuit may not be changed when the single phase synchronization is adopted in the normal circuit.

On the other hand, FIG. 11B shows a control waveform which appears during the delay test or in a delay test mode. In this event, the terminal 102 is changed from the logic value "0" into the logic value "1" at the timings t21 and t24 while the terminal 101 is changed from the logic value "0" into the logic value "1" at the timings t22 and t25.

Further, the terminals 101 and 102 are changed from the logic value "1" to the logic value "0" at the timing t23 and t26. Herein, although the terminals 101 and 102 are changed from the logic value "1" into the logic value "0" at the timing t23 and t26 at the same time, they may not be always changed at the same time.

In this event, the data signal are inputted to the flip-flop circuits 105 and 106 (FIG. 9) at the timing t21 and t24 and outputted at the timings of t22 and t25. Therefore, the delay test can be carried out by judging whether or not the data signal which is outputted from the flip-flop circuit 105 at the timing of t22 can be inputted into the flip-flop circuit 106 at the timing t24.

In the meanwhile, a conventional delay test has been carried out by the use of the time difference between t21 and t24. This means that the conventional delay test depends on a frequency of an output clock supplied from the tester.

In contrast, the delay test according to the embodiment of this invention can be carried out by the use of the time difference between t22 and t24. This shows that the delay test can be performed by shortening the time difference between t22 and t24 without an increase of the frequency of the output clock. In other words, a clock period for the delay test can be equivalently shortened without an increase of a frequency of the output clock of the tester.

Namely, it can be tested whether or not the total circuit operates within the time difference between t22 and t24 as the period of the actual operation frequency of the LSI and by giving a test pattern. In this event, the delay test can be executed by checking whether or not a preselected output is obtained.

Moreover, when the delay test is carried out for a specific path, for example, when the delay test is carried out for a path between flip-flop circuits 105 and 106, the circuit between 105 and 106 has a logic structure which is equivalent to the inverter. In this case, the logic value "0" is inputted to the flip-flop 106 and the logic value "0" is inputted to the flip-flop 105 at the timing t21. In this event, the changing timing of t22 is determined so that the timing difference between t22 and t24 becomes a permissible path delay between the flip-flop circuits 105 and 106. Further, the value is outputted from the flip-flop circuit 105 at the timing t22 and is fetched into to the flip-flop circuit 106 at the timing t24.

It is judged whether or not the value of the flip-flop circuit 106 is changed from the logic value "0" into the logic value "1". Thereafter, the value is transmitted to the output terminal. When the delay test is carried out for the specific path, it is unnecessary to shorten the difference between an output timing and input timing and the frequency of the clock at the timing except when the specific path is activated.

Although an overhead of the flip-flop circuits slightly exists in the above method, such an overhead is restricted to only the NOR gate 114 and the inverter 115 illustrated in FIG. 10 even when the CMOS structure is adopted. Consequently, the overhead is excessively small as compared with the conventional structure.

Figure 12:
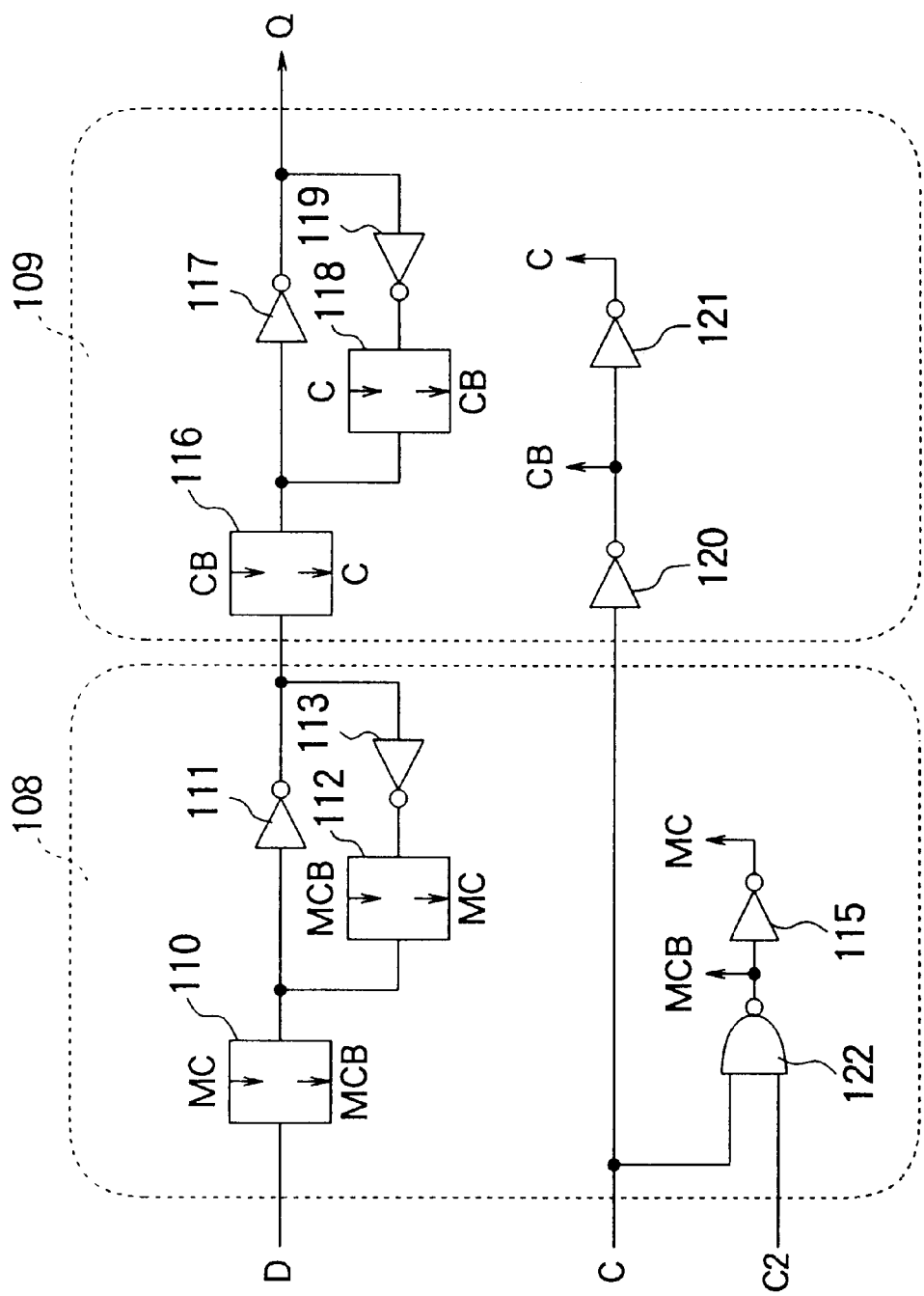
FIG. 12 is a circuit diagram showing a second structure example of each of flip-flop circuits 105 and 106 illustrated in FIG. 9.
Figure 13A:
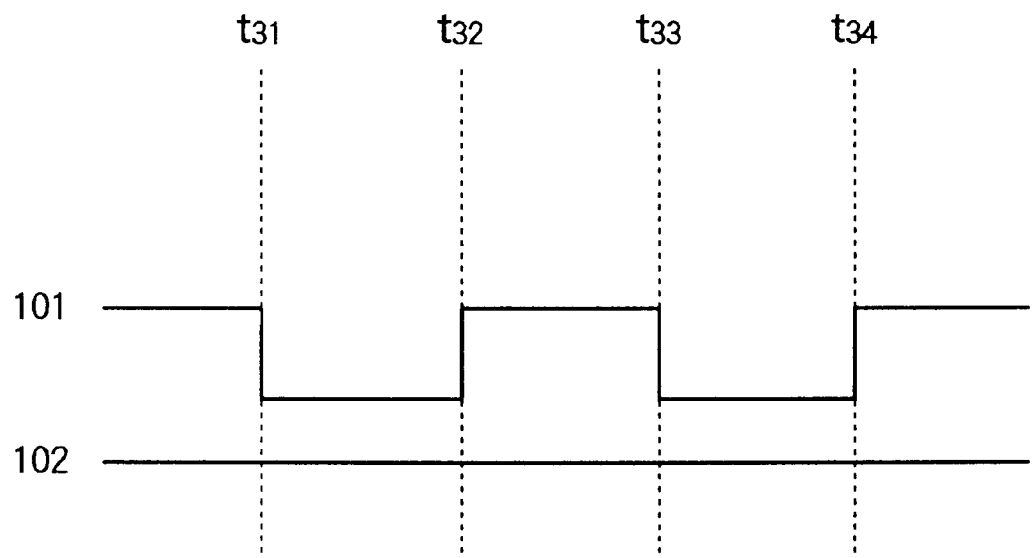
FIG. 13A is a timing chart during a normal operation of the second structure example.
Figure 13B:
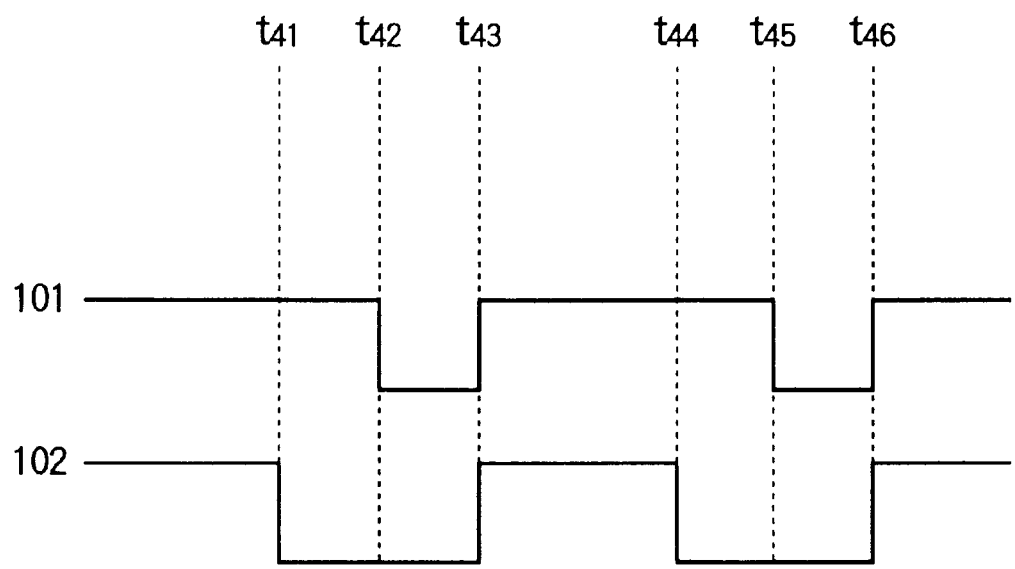
FIG. 13B is a timing chart during a delay test of the second structure example.

FIG. 12 shows a second example of each of the flip-flop circuits 108 and 109. In the second example, edges of the input and output timings in the first example are reversed, as illustrated in FIGS. 13A and 13B. Further, a NAND gate 122 is used instead of the NOR gate 114 of the flip-flop illustrated in FIG. 10.

As illustrated in a waveform in FIG. 13A, the reference numerals 101 and 102 on the left-hand side represent the waveforms of the terminal 101 and the terminal 102 in FIG. 9. This is also similar in FIG. 13B. The terminal 101 is changed from the logic value "1" into the logic value "0" at the timings t31 and t33 while the terminal 101 is changed from the logic value "0" into the logic value "1" at the timings t32 and t34. During a normal operation, the terminal 102 is kept at the logic value "1" to operate as the flip-flop of the single-phase synchronous operation, as illustrated in FIG. 13A.

On the other hand, FIG. 13B shows a control waveform which appears during the delay test. The terminal 102 is changed from the logic value "1" into the logic value "0" at the timings t41 and t44 while the terminal 101 is changed from the logic value "1" into the logic value "0" at the timings t42 and t45. Further, the terminals 101 and 102 are changed from the logic value "0" into the logic value "1" at the timing t43 and t46. In this case, although the terminal 101 and 102 are changed from the logic value "0" into the logic value "1" at the timing t43 and t46 at the same time, they may not be always changed at the same time.

In this event, the data signals are inputted to the flip-flop circuits 105 and 106 at the timing t41 and t44, and are outputted at the timing t42 and t45. Consequently, the delay test can be carried out by the use of the time difference between t42 and t44.

Figure 14:
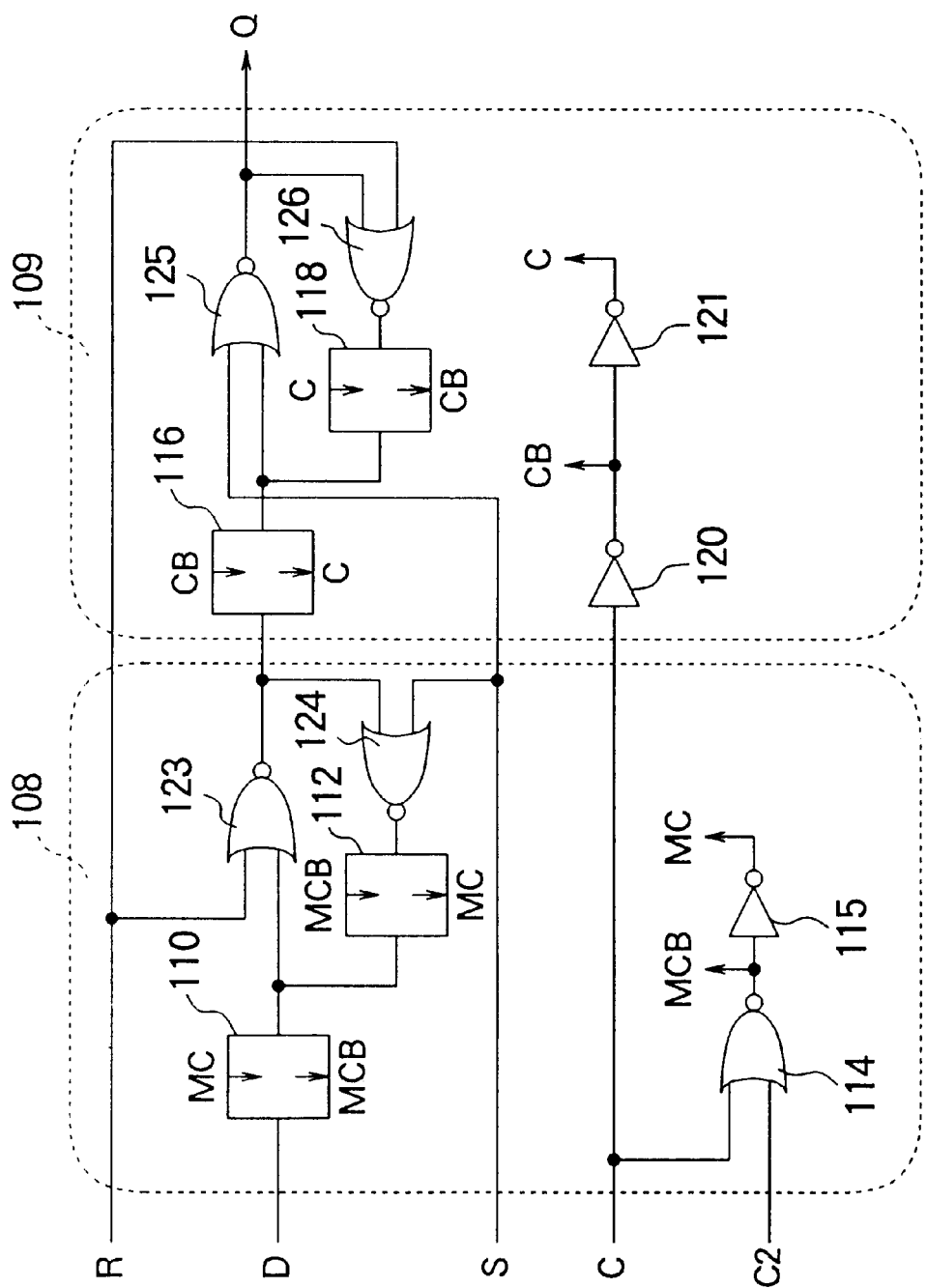
FIG. 14 is a circuit diagram showing a third structure example of each of flip-flop circuits 105 and 106 illustrated in FIG. 9.

FIG. 14 shows a third structure example of the flip-flop. A set input S and a rest input R are added to the first structure example illustrated in FIG. 10 in the flip-flop circuits 105 and 106 according to the third structure example. Further, NOR gates 123, 124, 125 and 126 are arranged instead of the inverters 111, 113, 117 and 119 in the third structure example. In this example, the set and reset become enable at the logic value "1". Thus, the set and reset signals can be added like the normal flip-flop.

Subsequently, description will be made about a second embodiment of this invention, referring to FIG. 15.

The scan path is used in the second embodiment. In this event, the reference numerals 207 and 208 represent scan-path flip-flop circuits. Further, the reference numeral 201 denotes a normal clock terminal, the reference numeral 202 denotes a test clock input terminal, the reference numeral 203 denote a signal terminal for switching a shift mode and a normal mode. Further, the reference numeral 204 denotes a scan input terminal, the reference numeral 209 denotes a scan output terminal, the reference numeral 205 denotes a normal input terminal group, the reference numeral 210 denotes a normal output terminal group, and the reference numeral 206 denoted a normal circuit, respectively.

In this event, the normal circuit 206 includes the scan-path flip-flop circuits other than the scan-path flip-flop circuits 207 and 208.

Figure 15:
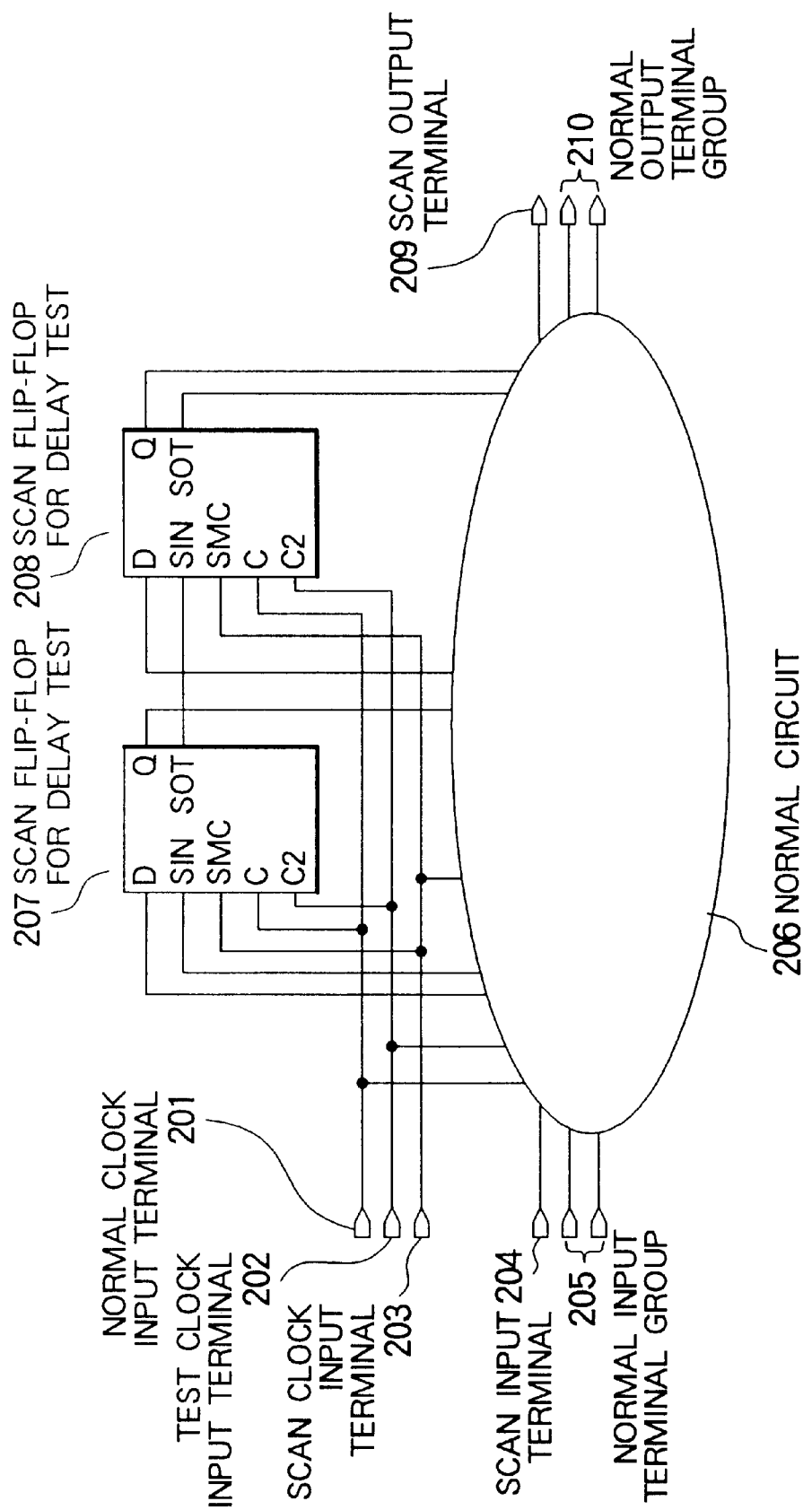
FIG. 15 is a circuit structure of a second embodiment according to this invention.
Figure 16:
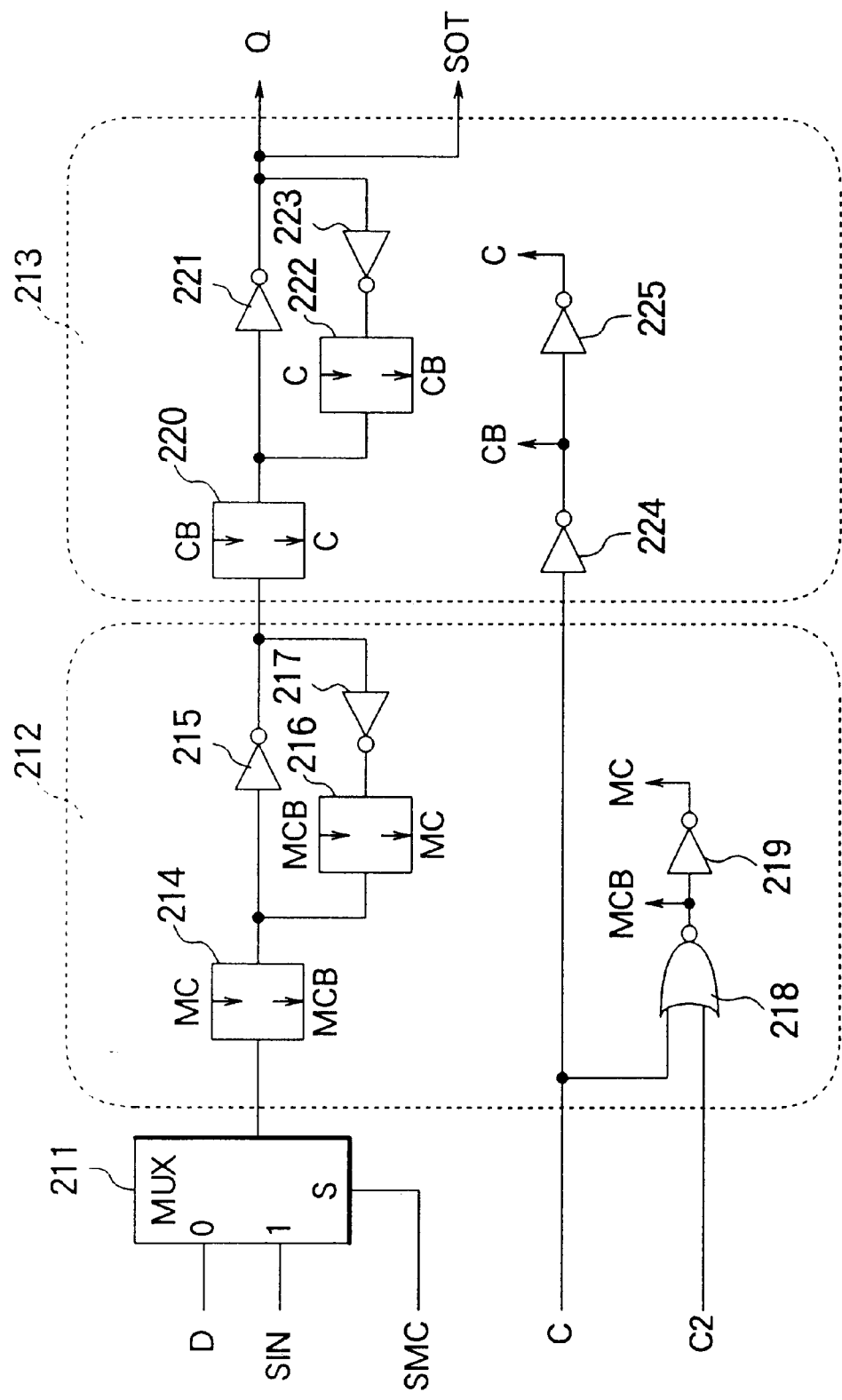
FIG. 16 is a circuit diagram showing a structure example of each of flip-flop circuits 207 and 208 illustrated in FIG. 15.

FIG. 16 shows a structure example of each of the scan path flip-flop circuits 207 and 208. In this event, signal names D, SIN, SMC, C, C2, Q and SOT at the right-hand side and the left-hand side in FIG. 16 correspond to signals which are indicated by the scan-path flip-flop circuits 207 and 208 in FIG. 15, and represent a data input, a scan data input, a shift mode signal input, a normal clock input, a test clock input, a data output, and a scan-data output, respectively. In this case, although the data output Q is separated from the scan-data output SOT, they may be commonly used.

Further, although the scan data output of the scan-path flip-flop 207 is connected the scan data input of the scan path flip-flop 208 in FIG. 15, there is no limit with respect to the connection order during the shift mode of the scan-path. Each of the scan-path flip-flop circuits 207 and 208 is composed of a selector 211, a master latch 212 and a slave latch 213, as illustrated in FIG. 16.

The selector 211 selects an input of a symbol O when an input of the symbol S described at the selector 211 is equal to a logic value "0" while the selector 211 selects the input of the symbol 1 when the input of the symbol S is equal to a logic value "1". Namely, when the value of SMC is equal to the logic value "0" in this example, the data of the normal circuit 206 is selected and inputted. On the other hand, when the value of SMC is equal to the logic value "1", the scan-in data, namely the shift data is selected and inputted.

The master latch 212 is composed of transistor pairs 214 and 216, inverters 215, 217 and 219, and a NOR gate 218 while the slave latch 213 is structured of transistor pairs 220 and 222, and inverters 221, 223, 224 and 225.

When the scan path structure is constituted, it can be easily performed to set values to circuit to be tested and also to observe tested results. The delay test is carried out by utilizing the timing difference between the timing at which the terminal 201 is changed from the logic value "0" into the logic value "1" and the timing at which the terminal 202 is changed from the logic value "0" into the logic value "1" in the same manner.

Figure 17:
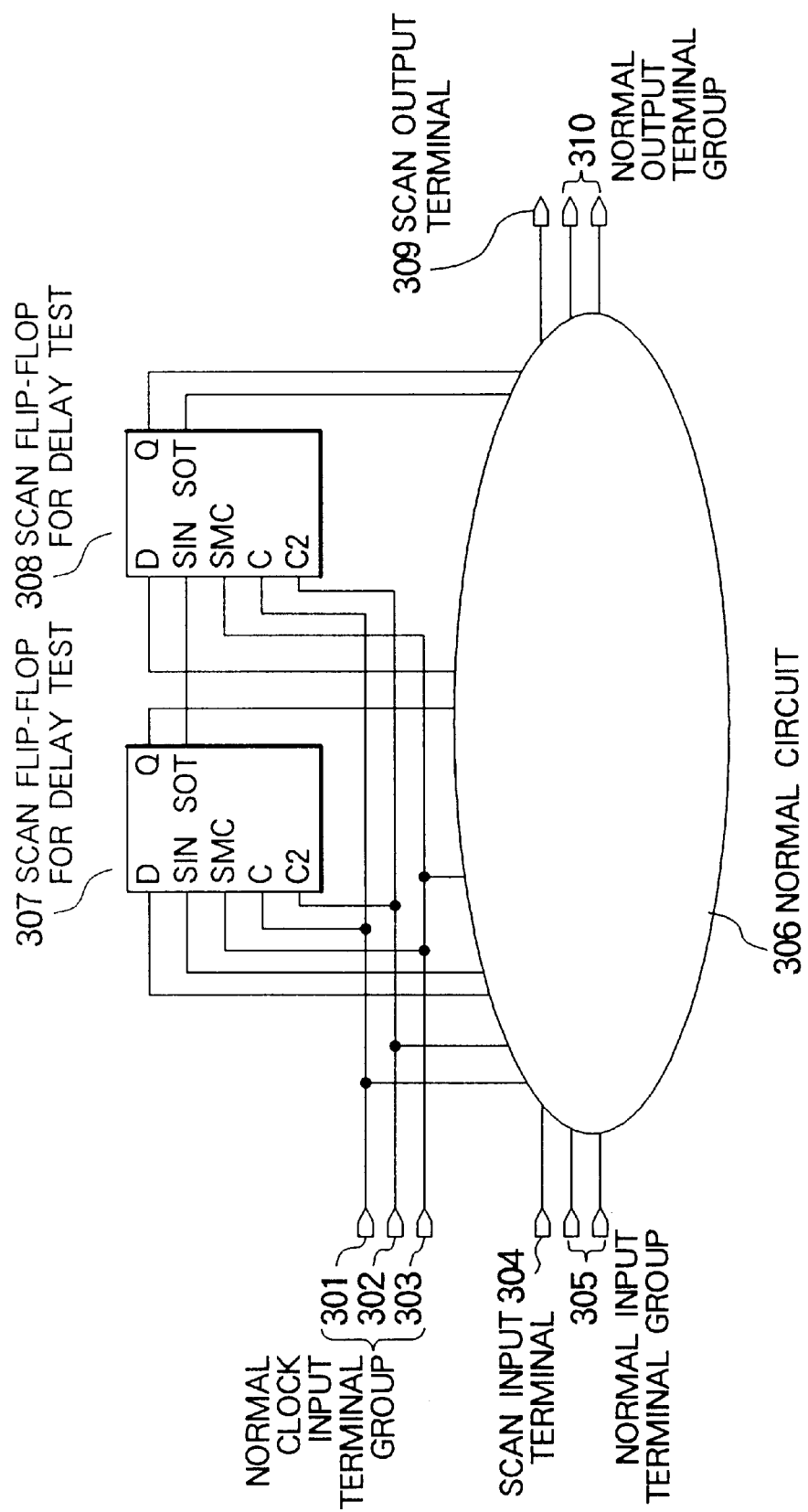
FIG. 17 is a circuit structure of a third embodiment according to this invention.

FIG. 17 shows a circuit structure according to the third embodiment of this invention.

In this event, the reference numerals 307 and 308 denote the scan path flip-flop circuits. The scan path system in this embodiment corresponds to the clocked scan system. Specifically, the select signal is not used to select the normal data input and the scan data input, and the clock is instead used.

Herein, the reference numeral 301 denotes a normal clock terminal, the reference numeral 302 denotes a test clock terminal, the reference numeral 303 denotes a clock terminal for shifting the scan path, the reference numeral 304 denotes a scan input terminal, the reference numeral 309 denotes a scan output terminal, the reference numeral 305 denotes a normal input terminal group, the reference numeral 310 denotes a normal output terminal group and the reference numeral 306 denotes a normal circuit, respectively. In this event, the normal circuit 306 includes the scan path flip-flop circuits other than the scan path flip-flop circuits 307 and 308.

Figure 18:
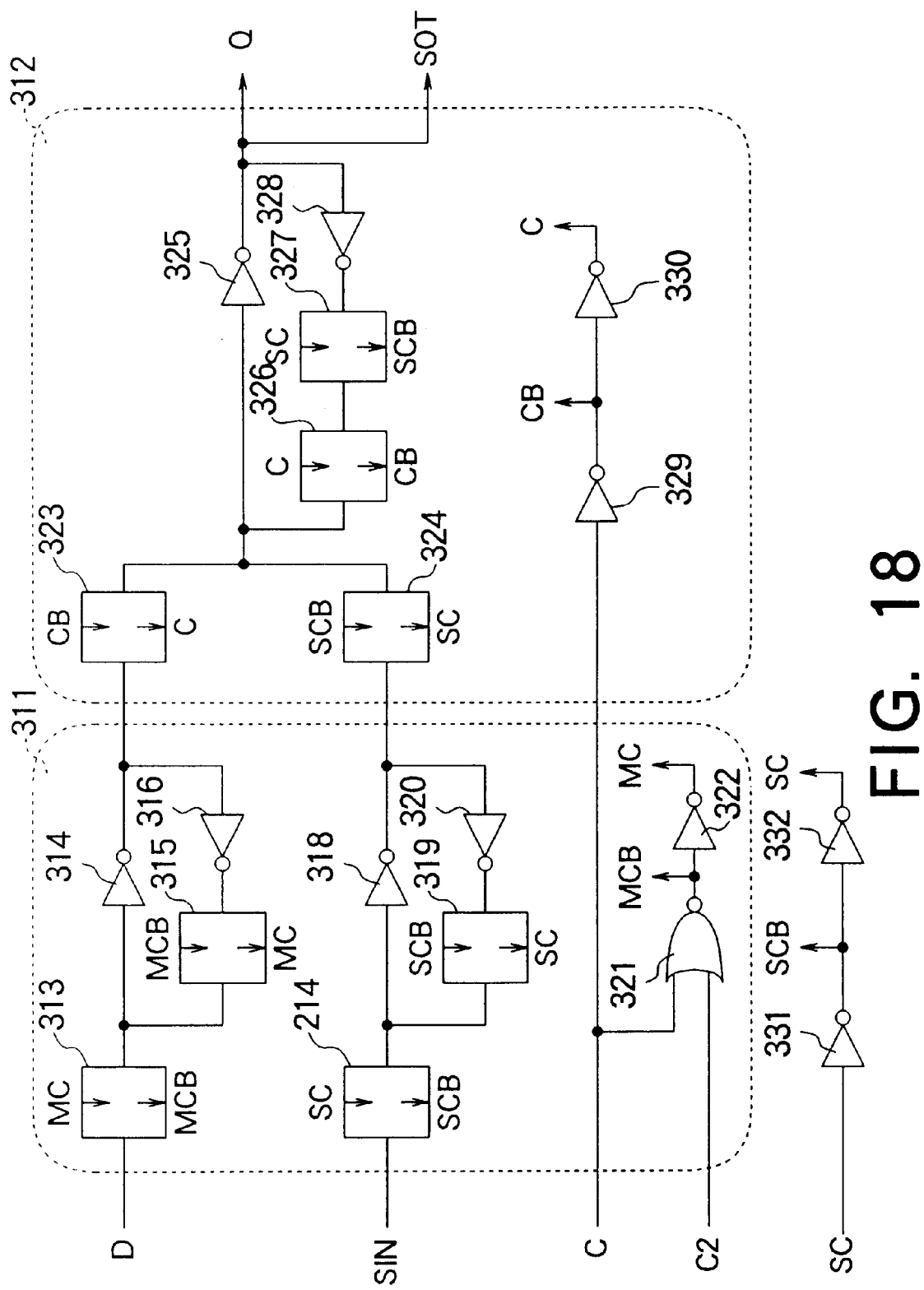
FIG. 18 is a circuit diagram showing a structure example of each of flip-flop circuits 307 and 308 illustrated in FIG. 17.

FIG. 18 shows a structure example of each the scan path flip-flop circuits 307 and 308. Signal names D, SIN, C, C2, SC, Q, and SOT which are described at the right-hand side and the left-hand side in FIG. 18 correspond to the symbols which are described at the scan path flip-flop circuits 307 and 308 in FIG. 17, and represent a data input, a scan data input, a normal clock input, a test clock input, a scan shift clock input, a data output, and a scan data output, respectively. In this event, although the data output Q is separated from the scan date output SOT, that may be commonly used. Further, although the scan data output of the scan path flip-flop 307 is connected to the scan data input of the scan path flip-flop 308 in FIG. 17, there is no limit with respect to the connection order of the scan path during the shift mode.

Each of the scan path flip-flop circuits 307 and 308 is structured by a master latch 311, a slave latch 312 and inverters 331 and 332. In this event, the master latch 311 is composed a transistor pairs 313, 315, 317 and 319 inverters 314, 316, 318, 320 and 322, and a NOR gate 321. On the other hand, the slave latch 312 is composed of transistor pairs 323, 324, 326 and 327, inverters 325, 328, 329 and 330. The description method of the transistor pairs 313, 315, 317, 319, 323, 324, 326 and 327 is identical with that in FIG. 10.

In this embodiment, when the input C and the input C2 are used on the condition that the input SC is fixed to the logic value "0", the value of the input D corresponding to the normal data input is inputted to carry out the same operation as that in FIG. 10. When the input SC is operated on the condition that the input C and the input C2 are set to the logic value "0", the value of the scan data SIN is inputted to output the scan data output SOT. In this example, the value is also set for the path to be tested by the use of the scan path structure and the test result is also obtained by the use of the scan path structure. Namely, the delay test is carried out by utilizing the time difference between the timing at which the terminal 301 is changed from the logic value "0" into the logic value "1" and the timing at which the terminal 301 is changed from the logic value "0" into the logic value "1".

Figure 19:
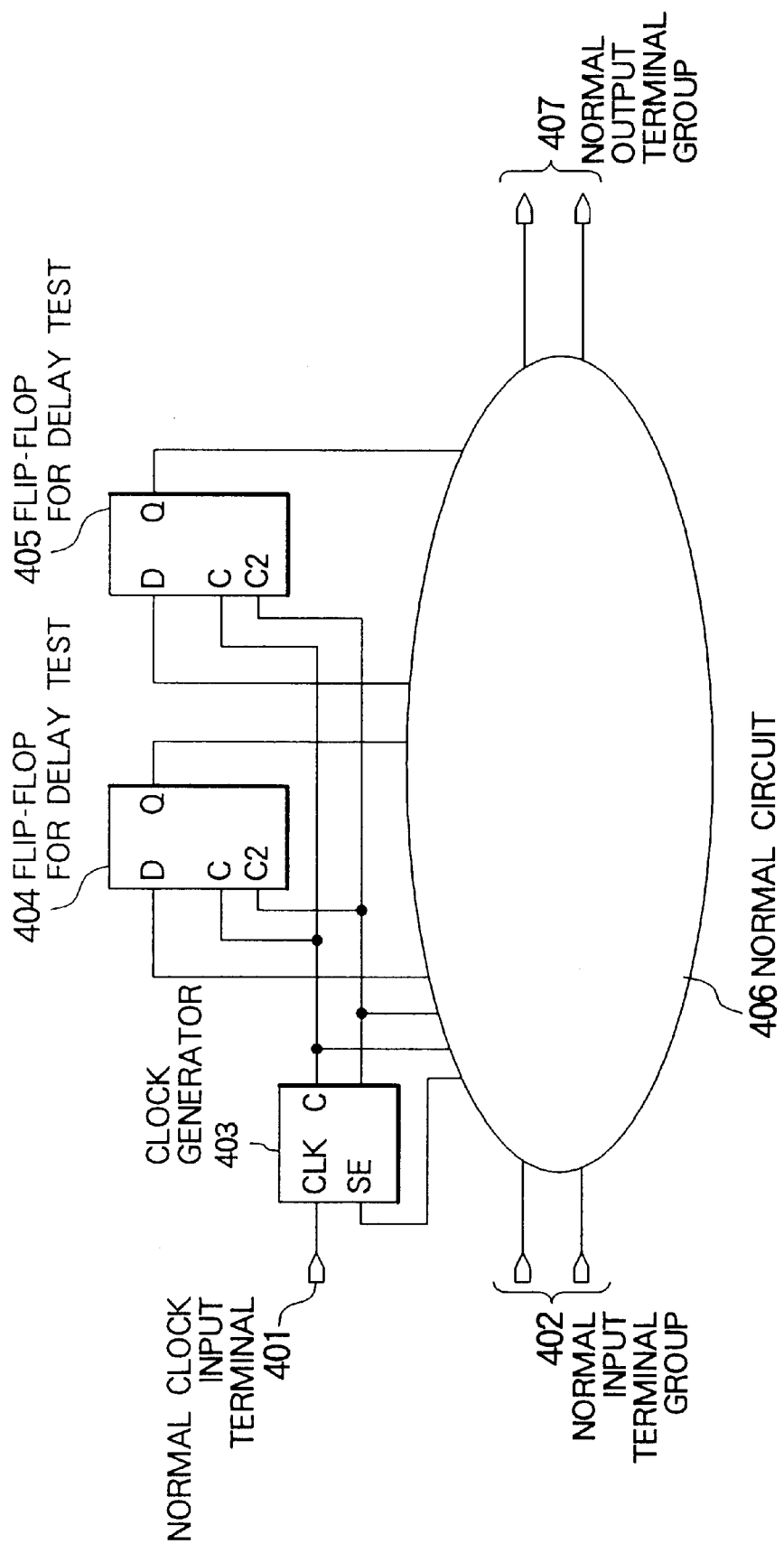
FIG. 19 is a circuit structure of a fourth embodiment according to this invention.

FIG. 19 shows a circuit structure of a fourth embodiment of this invention. In this example, a single external clock terminal is prepared, and a clock generator 403 generates a test clock. In this event, the reference numeral 401 denotes an external clock terminal which is used during both the normal operation and the test operation. The reference numerals 404 and 405 denote a pair of flip-flop circuits for performing the delay test.

The reference numeral 406 denotes an internal circuit which includes a portion to be tested. The reference numeral 402 denotes an input terminal group of the normal circuit 406 while the reference numeral 407 denotes an output terminal group of the normal circuit 406. Each of the flip-flop circuits 404 and 405 has the structure illustrated in FIG. 10. The reference numeral 403 denotes a clock generator. When the value which indicates the normal mode is given to an input SEL, an output C2 of the clock generator 403 becomes a logic value "0" and a value of the input CLK is directly outputted to the output C. On the other hand, when the value which indicates the test mode is given to the input SEL, the clocks of the separated timings are outputted to the output C and the output C2, respectively.

Figure 20:
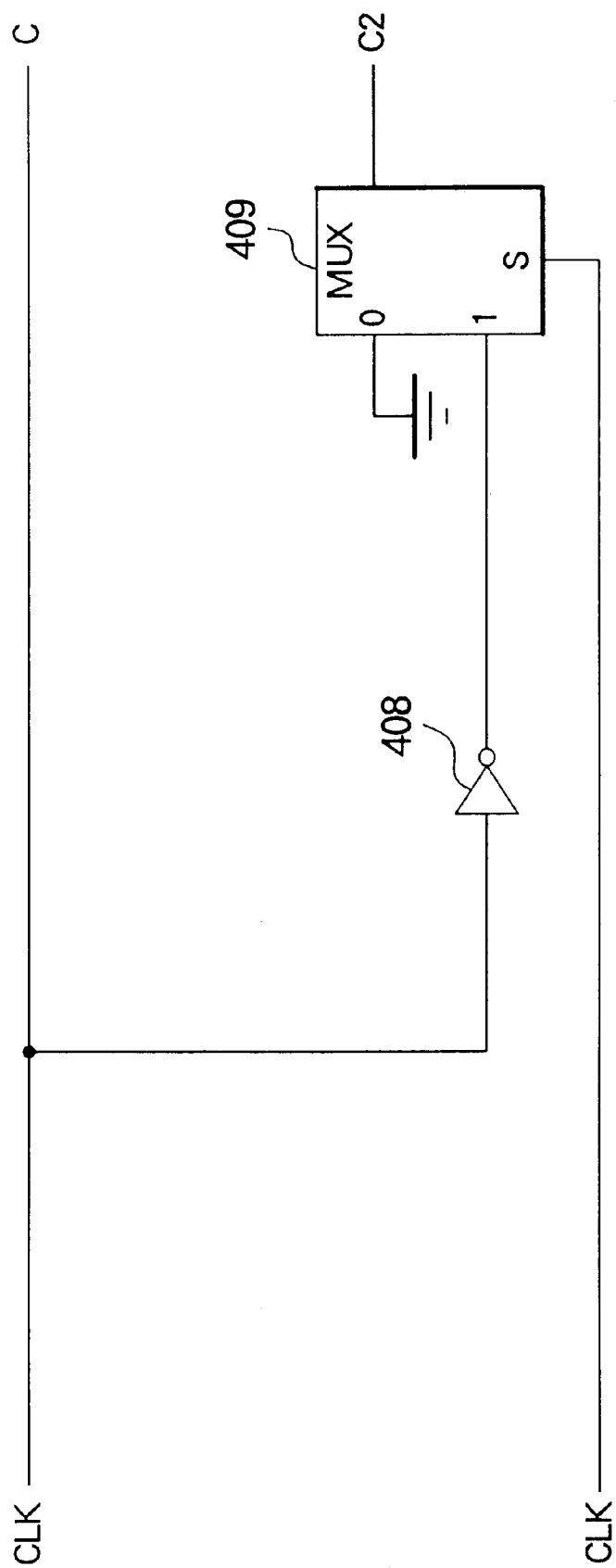
FIG. 20 is a circuit diagram of a clock generator 403 illustrated in FIG. 19.

FIG. 20 shows a circuit structure of the clock generator 403 illustrated in FIG. 19.

Signal names described on the left-hand side and the right hand side CLK, SEL, C and C2 in FIG. 20 correspond to the signal names of the clock generator 403 in FIG. 19 and represent a clock input, a select input, a normal clock output, and a test clock output. In addition, the clock generator 403 is composed of an inverter 408 and the selector 409, as illustrated in FIG. 20. The selector 409 selects the input mentioned as 0 when the input mentioned as S is equal to the logic value "0" while selector 409 selects the input mentioned as 1 when the input S is equal to the logic value "1".

Figure 21A:
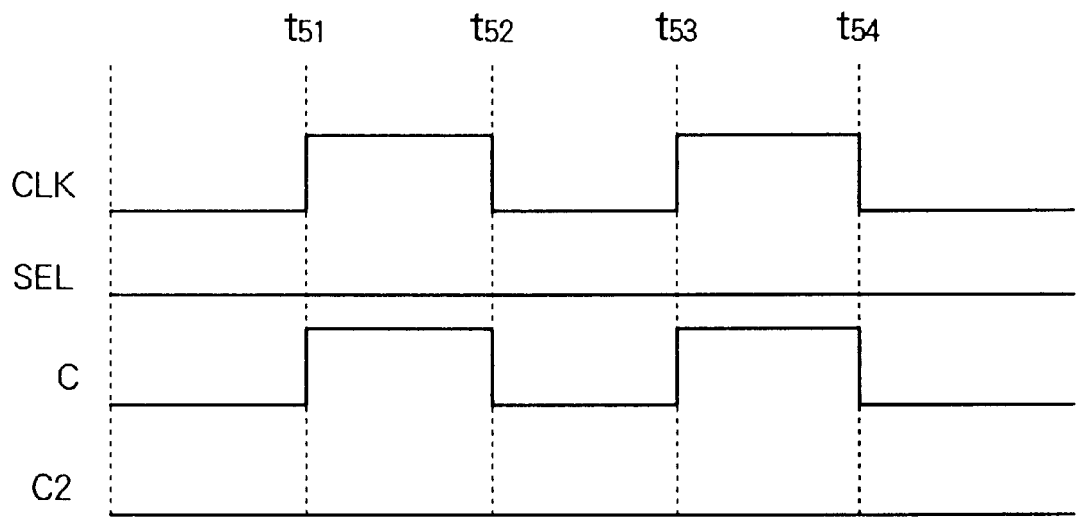
FIG. 21A is a timing chart during a normal operation of the fourth embodiment.
Figure 21B:
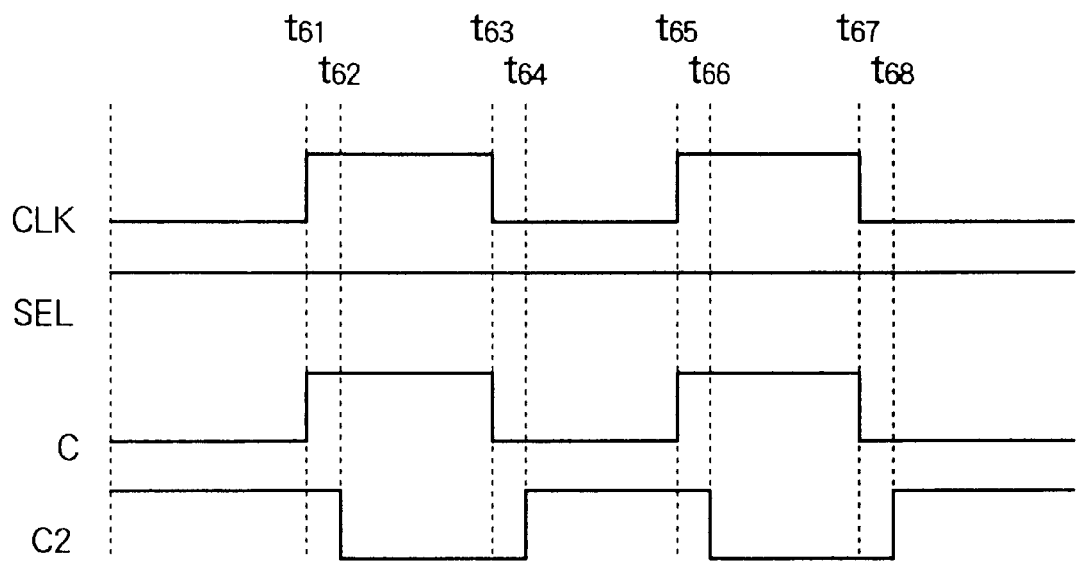
FIG. 21B is a timing chart during a delay test of the fourth embodiment.

FIG. 21A shows a control waveform appearing during the normal operation when the clock generator 403 illustrated in FIG. 20 is used. Further, FIG. 21B shows a control waveform appearing during the test operation when the clock generator 403 illustrated in FIG. 20 is used.

As shown in FIG. 21A, when the input SEL is equal to the logic value "0", the output C2 always becomes the logic value "0". Moreover, as illustrated in FIG. 21B, when the input SEL is equal to the logic value "1", the reverse value of the input CLK is outputted from the output C2. Herein, the input CLK is changed from the logic value "0" into the logic value "1" at the timings t51, t53, t61 and t65 while the input CLK is changed from the logic value "1" into the logic value "0" at the timings t52, t54, t63 and t67. The changing timing of the output C2 is delayed from the input CLK. This is caused by the delay of the inverter 408 and the selector 409 illustrated in FIG. 20.

With respect to the relation of the timing at which the output C and the output C2 reach the flip-flop circuits 404 and 405 to be driven in FIG. 19, namely, the relation of the change timing of the clock input of each of the flip-flop circuits 404 and 405, the timing at which the input C2 changes from the logic 1 into the logic 0 should be delayed from the timing at which the input C changes from the logic value "0" into the logic value "1" in the flip-flop circuits 404 and 405 in FIG. 19. This is because, when the master side latch changes from the hold state into the through state before the value is outputted from the slave side latch, the value which is newly inputted into the master side latch other than the value which is held at the master side latch is outputted via the slave side latch, and as a result, the delay test becomes difficult.

In this case, the adjustment is carried out by the use of the delay of the inverter 408 and the selector 408 to delay the timing at which the input C2 of the flip-flop circuits 404 and 405 changes from the logic value "1" into the logic value "0" from the timing at which the input C changes from the logic value "0" into the logic value "1". In this event, such a delay adjustment is unnecessary when the timing at which the input C2 changes from the logic value "1" into the logic value "0" is delayed the timing at which the input C changes from the logic 0 into the logic 1. In this example, the delay test can perform by the timing difference between t61 and t64. The time is required to be determined by considering the delay of the inverter 408 and the selector 409 to be inserted. Basically, the delay test can be carried out based upon a pulse width of one external clock other than the clock frequency.

What is claimed is:

1. A delay test system for an LSI including an electronic circuit which is selectively operable in a normal mode and a test mode and which has a circuit to be tested and a plurality of flip-flop circuits each of which is serially connected to each other via said circuit to be tested to perform a delay test for said electronic circuit, comprising, in combination:

a first clock input terminal which is connected to said plurality of flip-flop circuits and said electronic circuit to input a normal mode clock signal generated in the normal mode; and a second clock input terminal which is connected to said flip-flop circuits and a normal circuit to input a test clock signal;

the test mode being carried out in synchronism with a first edge timing of the normal mode clock signal and a second edge timing of the test clock signal while the normal mode is carried out by the use of the normal mode clock signal with the test clock signal kept inactive.

2. A system as claimed in claim 1, wherein:

said flip-flop executes a single-phase synchronous operation in the normal mode while said flip-flop executes a double phase synchronous operation in the test mode, the second clock input terminal being kept to a constant logic value in the single phase synchronous operation, the first and second clock input terminals being separately driven in the double phase synchronous operation.

3. A system as claimed in claim 1, wherein:

said flip-flop is divided into a master latch and a slave latch, the master latch is connected to the first and second clock input terminals and which includes a NOR gate and a first inverter, the slave latch includes a second inverter which is connected the first clock input terminal and a third inverter which is serially connected to the second inverter.

4. A system as claimed in claim 3, wherein:

the second clock input terminal is kept to a logic value "0" during the normal operation, and the edge timings define a time difference between a first rise edge timing of the normal mode clock signal and a second rise edge timing of the test clock signal.

5. A system as claimed in claim 1, wherein:

said flip-flop circuit is divided into a master latch and a slave latch, the master latch is connected to the first and second clocks input terminals and which includes a NAND gate and a first inverter, the slave latch includes a second inverter which is connected to the first clock input terminal and a third inverter which is serially connected to the second inverter.

6. A system as claimed in claim 5, wherein:

the second clock input terminal is kept to a logic value "1" during the normal operation, and the edge timings define a time difference between a first fall edge timing of the normal mode clock signal and a second fall edge timing of the test clock signal.

7. A delay test system including a normal circuit which has a portion to be tested and a plurality of flip-flop circuits each of which is serially connected to each other via said normal circuit to perform a delay test for said normal circuit, comprising, in combination:

a normal clock input terminal for inputting a normal clock signal; and a clock generator which is connected to the normal clock input terminal, said plurality of flip-flop circuits and said normal circuit and which additionally generates a test clock input signal, an input and output operation of data signals being carried out in synchronism with edge timing signals of the normal clock signal during a normal operation on the condition that the test clock input terminal is halted, said normal clock input signal and the test clock input signal being separately driven during the delay test so that the delay test is carried out by the use of a timing difference between a first edge timing signal generated by the normal clock signal and a second edge timing signal generated by the test clock.

8. A system as claimed in claim 7, wherein:

said scan flip-flop circuit executes a single phase synchronous operation during the normal operation while said flip-flop executes a double phase synchronous operation during the delay test operation, the test clock signal being kept to a constant logic value in the single phase synchronous operation, the normal and test clock signals being separately operated in the double phase synchronous operation.

9. A system as claimed in claim 7, wherein:

said clock generator includes an inverter which is the normal clock input terminal and a selector which is connected to said inverter.

* * * * *